(12) United States Patent
Huang et al.

(10) Patent No.: US 8,258,545 B1
(45) Date of Patent: Sep. 4, 2012

(54) INTEGRATED CIRCUIT INCLUDING A BIPOLAR TRANSISTOR AND METHODS OF MAKING THE SAME

(75) Inventors: Wei-Tung Huang, Tainan (TW);
Chun-Tsung Kuo, Tainan (TW);
Shih-Chang Liu, Alian Township (TW);
Yeur-Luen Tu, Taichung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/047,468

(22) Filed: Mar. 14, 2011

(51) Int. Cl.
*H01L 29/73* (2006.01)

(52) U.S. Cl. ........ 257/197; 257/565; 257/590; 257/591; 257/592; 257/593; 438/345

(58) Field of Classification Search ................... 257/565, 257/588; 438/369, 345
See application file for complete search history.

(56) References Cited

U.S. PATENT DOCUMENTS

| | | | |
|---|---|---|---|
| 7,989,301 B2 * | 8/2011 | Yang | 438/309 |
| 2001/0017399 A1 * | 8/2001 | Oda et al. | 257/565 |
| 2006/0163697 A1 * | 7/2006 | Seo et al. | 257/565 |

* cited by examiner

*Primary Examiner* — Marcos D. Pizarro
*Assistant Examiner* — Bilkis Jahan
(74) *Attorney, Agent, or Firm* — Lowe Hauptman Ham & Berner, LLP

(57) ABSTRACT

An integrated circuit includes a bipolar transistor disposed over a substrate. The bipolar transistor includes a base electrode disposed around at least one germanium-containing layer. An emitter electrode is disposed over the at least one germanium-containing layer. At least one isolation structure is disposed between the emitter electrode and the at least one germanium-containing layer. A top surface of the at least one isolation structure is disposed between and electrically isolating a top surface of the emitter electrode from a top surface of the at least one germanium-containing layer.

20 Claims, 11 Drawing Sheets

INTEGRATED CIRCUIT INCLUDING A BIPOLAR TRANSISTOR AND METHODS OF MAKING THE SAME

TECHNICAL FIELD

The present disclosure relates generally to the field of semiconductor, and more particularly, to integrated circuits including bipolar transistors and methods of making the same.

BACKGROUND

As semiconductor integrated circuit microelectronic fabrication functionality and integration levels have increased, and semiconductor device dimensions have decreased, it has become more common in the art of semiconductor integrated circuit microelectronic fabrication to employ hybrid devices, such as in particular bipolar complementary metal oxide semiconductor (BiCMOS) devices, when fabricating semiconductor integrated circuit microelectronic fabrications. BiCMOS devices are desirable in the art of semiconductor integrated circuit microelectronic fabrication when fabricating semiconductor integrated circuit microelectronic fabrications insofar as BiCMOS devices often provide an optimal compromise of enhanced semiconductor device speed and reduced semiconductor device power consumption when operating semiconductor integrated circuit microelectronic fabrications.

BRIEF DESCRIPTION OF THE DRAWINGS

The present disclosure is understood from the following detailed description when read with the accompanying figures. It is noted that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

Figure 1:
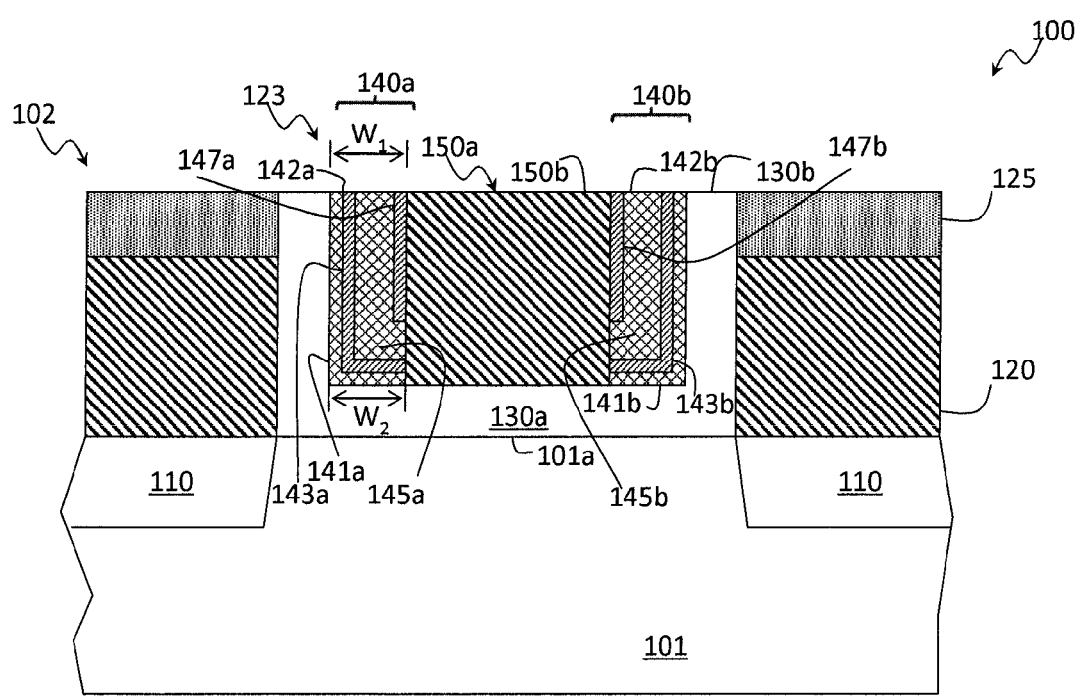
FIG. 1 is a schematic cross-sectional view illustrating an exemplary integrated circuit including a base and an emitter of a bipolar transistor disposed over a substrate.

A bipolar transistor has a base, an emitter and a collector. The collector is disposed around the base which is in turn disposed around the emitter. To increase the current gain of the bipolar transistor, a silicon-germanium (SiGe) material has been used between the base and the emitter to bandgap engineer the interface between the base and the emitter.

Conventionally, a dielectric spacer is formed between and electrically isolates the SiGe material from the emitter. However, it is found that, during the manufacturing the spacer is prone to being formed with a triangle shape in a cross-sectional view. The tip of the triangle between the SiGe material and the emitter may not desirably electrically isolate the SiGe material and the emitter.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

FIG. 1 is a schematic cross-sectional view illustrating an exemplary integrated circuit including a base and an emitter of a bipolar transistor disposed over a substrate. In FIG. 1, an integrated circuit 100 can include a substrate, e.g., a substrate 101. The integrated circuit 100 can include a bipolar transistor, e.g., a bipolar transistor 102 that is disposed over the substrate 101. The bipolar transistor 102 can include an electrode 120, e.g., a base electrode, which can be disposed around at least one germanium-containing layer, e.g., a germanium-containing layer 130a. The bipolar transistor 102 can include an electrode 150a, e.g., an emitter electrode, which can be disposed over the germanium-containing layer 130a. The bipolar transistor 102 can include at least one isolation structure, e.g., isolation structures 140a and 140b that can be each disposed between the electrode 150a and the germanium-containing layer 130a. Top surfaces 142a and 142b of the isolation structure 140a and 140b, respectively, can each be disposed between and electrically isolate a top surface 150b of the electrode 150a from a top surface 130b of the germanium-containing layer 130a.

In some embodiments, the substrate 101 may include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

Referring to FIG. 1, in some embodiments the integrated circuit 100 can include an isolation structure, e.g., a shallow trench isolation (STI) feature 110. The STI feature 110 can be disposed in the substrate 101. In some embodiments, the STI feature 110 can be formed by etching recesses (or trenches) in the substrate 101 and filling the recesses with a dielectric material. In some embodiments, the dielectric material of the STI feature 110 can include silicon oxide. In alternative embodiments, the dielectric material of the STI feature 110 may include silicon nitride, silicon oxy-nitride, fluoride-doped silicate (FSG), and/or a low-k dielectric material known in the art.

In some embodiments, the base electrodes 120 and 150a can each be made of at least one material including, material such as polysilicon, amorphous silicon, crystalline silicon, aluminum (Al), copper (Cu), titanium (Ti), titanium nitride (TiN), tantalum (Ta), tantalum nitride (TaN), tantalum carbide (TaC), tantalum silicon nitride (TaSiN), tungsten (W), tungsten nitride (WN), other suitable conductive materials, and/or any combinations thereof.

Referring again to FIG. 1, at least one etch-stop layer, e.g., an etch-stop layer 125 can be disposed over the electrode 120. In some embodiments, the top surface (not labeled) of the etch-stop layer 125 can be substantially leveled with the top surface 130b of the germanium-containing layer 130a. In other embodiments, the top surface (not labeled) of the etch-stop layer 125 can be above the top surface 130b of the germanium-containing layer 130a. In some embodiments, the etch-stop layer 125 can be made of a material including at least one of, for example, nitride, oxynitride, carbide, oxycarbide, other dielectric materials, and/or any combinations thereof.

In some embodiments, the germanium-containing layer 130a can be disposed along a sidewall and a bottom (not labeled) of an opening 123 of the electrode 120. In other embodiments, the germanium-containing layer 130a can extend from a sidewall to the bottom to another sidewall of the opening 123 as shown in FIG. 1. In still other embodiments, the germanium-containing layer 130a can continuously extend along the sidewall of the opening 123.

In some embodiments, the germanium-containing layer 130a can be made of a substantially pure germanium material or a SiGe material. In other embodiments, the germanium-containing layer 130a can have a substantially uniform Ge composition. In still other embodiments, the germanium-containing layer 130a can have a gradient SiGe feature in which the Si and Ge composition change from one ratio at one location to another ratio at another location of the gradient SiGe feature. In yet still other embodiments, the germanium-containing layer 130a can have a multi-layer structure. The multi-layer structure can have a substantially uniform or gradient SiGe feature.

In some embodiments, the isolation structures 140a and 140b can each be disposed on the respective sidewall of the germanium-containing layer 130a. In other embodiments, the isolation structures 140a and 140b can continuously extend to adjoin each other. In still other embodiments, the isolation structures 140a and 140b can be disposed around and along the sidewalls of the electrode 150a.

In some embodiments, the top surfaces 142a and 142b of the isolation structures 140a and 140b, respectively, can be substantially leveled with the top surface 150b of the electrode 150a and the top surface 130b of the germanium-containing layer 130a. In other embodiments, the top surfaces 142a and 142b of the isolation structures 140a and 140b, respectively, can be above a central portion of the top surface 150b of the electrode 150a. In some embodiments, the isolation structure 140a can have a top width $W_1$ and a bottom width $W_2$. The top width $W_1$ can be substantially equal to the bottom width $W_2$. In other embodiments, the top width $W_1$ can be smaller than the bottom width $W_2$ by, for example, about 23% or less.

In some embodiments, the isolation structures 140a and 140b can each include a multi-layer structure. For example, the isolation structures 140a and 140b can include dielectric layers 141a, 143a, 145a, 147a and 141b, 143b, 145b, 147b, respectively. The dielectric layers 141a and 141b can each be disposed adjacent to the respective sidewall of the germanium-containing layer 130a. The dielectric layers 143a, 145a, 147a and 143b, 145b, 147b can be sequentially disposed adjacent to the dielectric layers 141a and 141b, respectively. In some embodiments, the dielectric layers 141a, 143a, 145a and 147a can have surfaces (not labeled) that are substantially aligned with each other and perpendicular to a surface 101a of the substrate 101.

In some embodiments, the dielectric layers 141a and 141b can have an etch selectivity which is different than that of the dielectric layers 143a and 143b, respectively. In other embodiments, the dielectric layers 145a and 145b can have an etch selectivity which is different than that of the dielectric layers 147a and 147b, respectively. In still other embodiments, the dielectric layers 143a and 143b that are disposed between the dielectric layers 141a, 145a and 141b, 145b, respectively, can have an etch selectivity different than those of the dielectric layers 141a, 145a and 141b, 145b, respectively. In still other embodiments, the dielectric layers 145a and 145b that are disposed between the dielectric layers 143a, 147a and 143b, 147b, respectively, can have an etch selectivity different than those of the dielectric layers 143a, 147a and 143b, 147b, respectively.

In some embodiments, the dielectric layers 141a, 141b, 145a and 145b can each be made of silicon oxide. The dielectric layers 143a, 143b, 147a and 147b can each be made of a material selected from a group consisting of silicon nitride, silicon oxynitride, silicon carbide, silicon oxycarbide, silicon carbon nitride and silicon oxycarbon nitride. In other embodiments, the dielectric layers 141a, 141b, 145a and 145b can be made of silicon oxide, silicon nitride, silicon oxide and silicon nitride, respectively. The dielectric layers 141a, 141b, 145a and 145b can be referred to as an ONON structure. It is noted that though the isolation structures 140a and 140b each include a four-layer structure as shown in FIG. 1, the scope of this application is not limited thereto. In some embodiments, the isolation structures 140a and 140b can each include a dual-layer structure, a six-layer structure, or any multi-layer structure.

As noted, the top surfaces 142a and 142b of the isolation structure 140a and 140b, respectively, each is disposed between and electrically isolate the top surface 150b of the electrode 150a from the top surface 130b of the germanium-containing layer 130a. The concern that the germanium-containing layer 330a might electrically bridge to the electrode 150a can be reduced.

Figure 2:
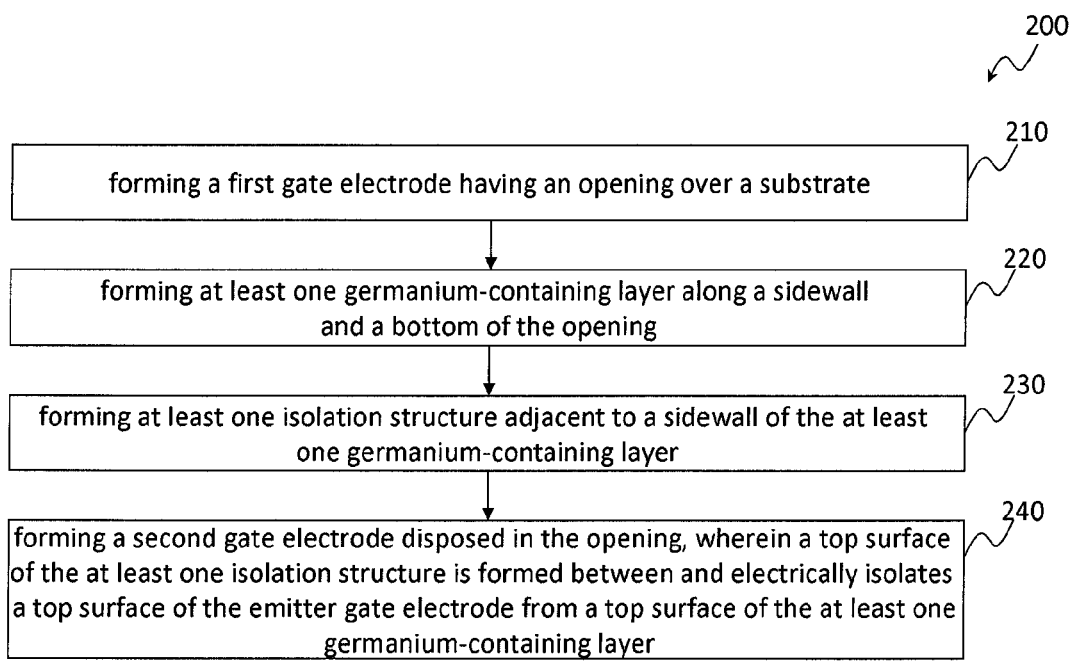
FIG. 2 is a flowchart of an exemplary method of forming an integrated circuit including a bipolar transistor.

FIG. 2 is a flowchart of an exemplary method of forming an integrated circuit including a bipolar transistor. FIGS. 3A-3I are schematic cross-sectional views of an integrated circuit during various fabrication stages. Items of a integrated circuit 300 in FIGS. 3A-3I that are the same or similar items of the integrated circuit 100 in FIG. 1 are indicated by the same reference numerals, increased by 200. It is understood that FIGS. 2 and 3A-3I have been simplified for a better understanding of the concepts of the present disclosure. Accordingly, it should be noted that additional processes may be provided before, during, and after the methods of FIGS. 2 and 3A-3I, and that some other processes may only be briefly described herein.

Referring now to FIG. 2, the method 200 can include forming a first electrode having an opening over a substrate (block 210). The method 200 can include forming at least one germanium-containing layer along a sidewall and a bottom of the opening (block 220). The method 200 can include forming at least one isolation structure adjacent to a sidewall of the at least one germanium-containing layer (block 230). The method 200 can also include forming a second electrode disposed in the opening (block 240). A top surface of the at least one isolation structure is formed between and electrically isolates a top surface of the emitter electrode from a top surface of the at least one germanium-containing layer.

Figure 3A:
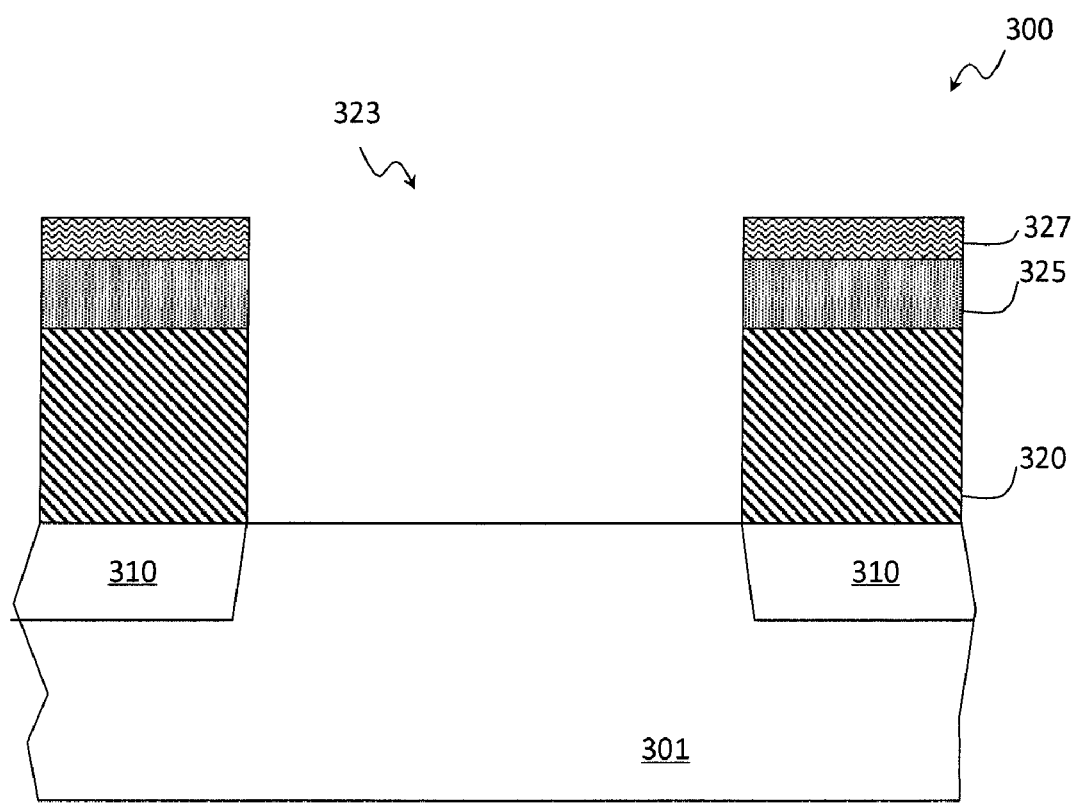
FIGS. 3A-3I are schematic cross-sectional views of an integrated circuit during various fabrication stages.

Referring now to FIGS. 3A-3I in conjunction with FIG. 2, an integrated circuit 300 can be fabricated in accordance with the method 200 of FIG. 2. As shown in FIGS. 2 and 3A, the block 210 can include forming an electrode 320 having an opening 323 over a substrate 301. The electrode 320 can be formed by, for example, a chemical vapor deposition (CVD) process. In some embodiments, an etch-stop layer 325 and a silicon-containing layer 327 can be sequentially formed over the electrode 320. The opening 323 can be formed through the etch-stop layer 325 and the silicon-containing layer 327. In some embodiments, the etch-stop layer 325 and the silicon-containing layer 327 can be formed, for example, by CVD.

Figure 3B:
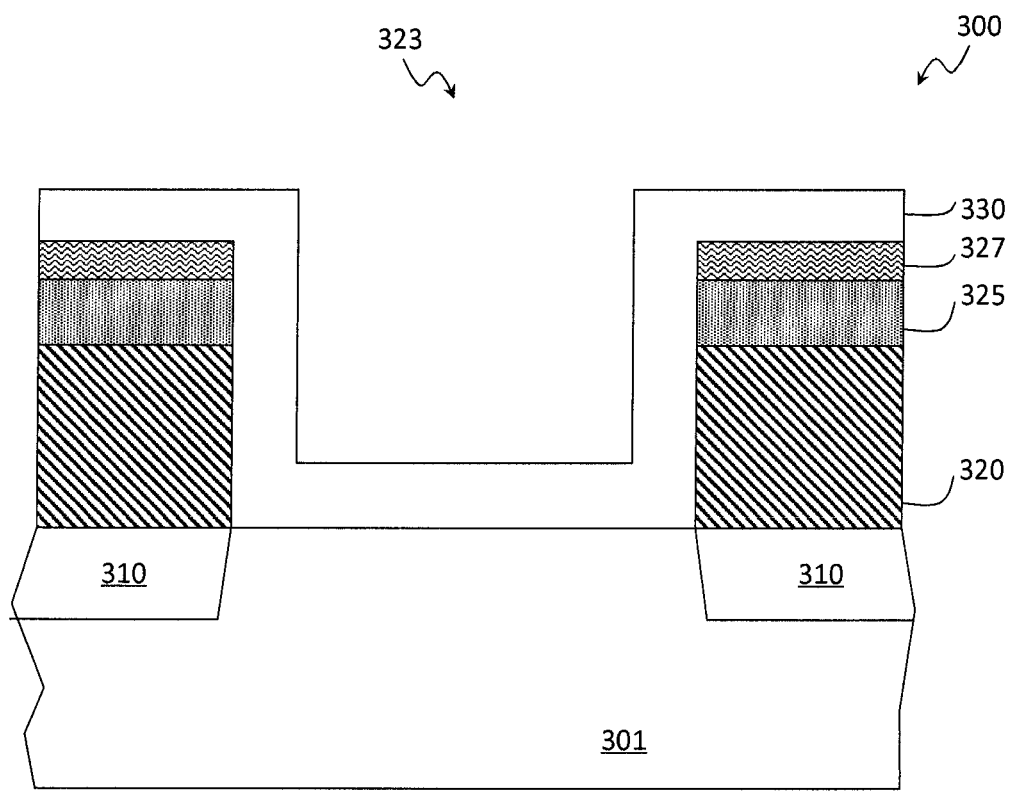

Referring to FIG. 2, the block 220 can include forming at least one germanium-containing layer along a sidewall and a bottom of the opening. For example, at least one germanium-containing material, e.g., a germanium-containing material 330 can be formed along sidewalls and a bottom of the opening 323 as shown in FIG. 3B. In some embodiments, the germanium-containing material 320 can continuously extend over the top surface (not labeled) of the silicon-containing layer 327. In some embodiments, portions of the germanium-containing material 330 can be removed to form the germanium-containing layer 330a as described below in conjunction with FIG. 3I. In some embodiments, the germanium-containing material 330 can be formed by, for example, a CVD process.

Figure 3C:
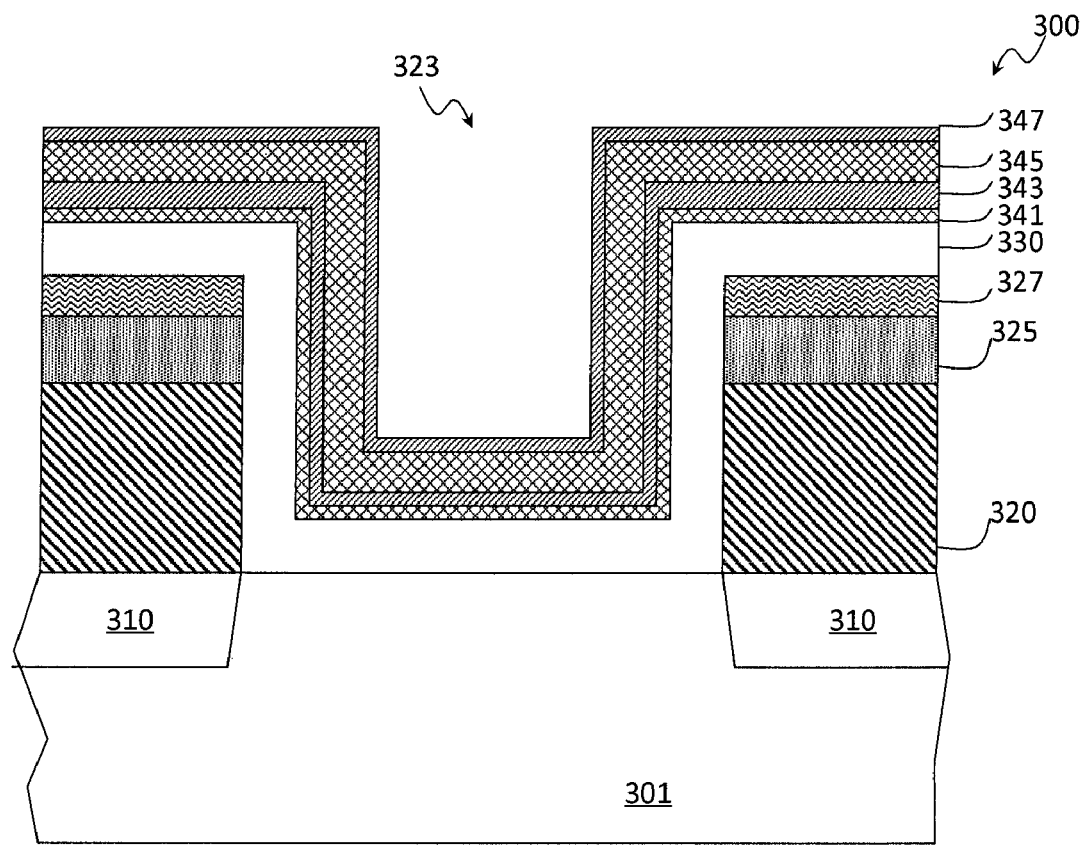

Referring to FIG. 2, the block 230 can include forming at least one isolation structure adjacent to a sidewall of the at least one germanium-containing layer. In some embodiments, the block 230 can include forming a plurality of dielectric materials, e.g., dielectric materials 341, 343, 345 and 347 that are sequentially formed over the germanium-containing material 330 as shown in FIG. 3C. In some embodiments, the dielectric materials 341, 343, 345 and 347 can be substantially conformal over the germanium-containing material 330.

In some embodiments, the dielectric materials 341, 343, 345 and 347 can be formed by a number of CVD processes. In other embodiments, the CVD processes can be formed in a single CVD chamber or single CVD equipment. For example, the dielectric materials 341, 343, 345 and 347 can be made of silicon oxide, silicon nitride, silicon oxide and silicon nitride, respectively. The multi-layer structure can be referred to as an ONON structure. In still other embodiments, the dielectric materials 341, 343, 345 and 347 can be formed in different chambers.

Figure 3D:
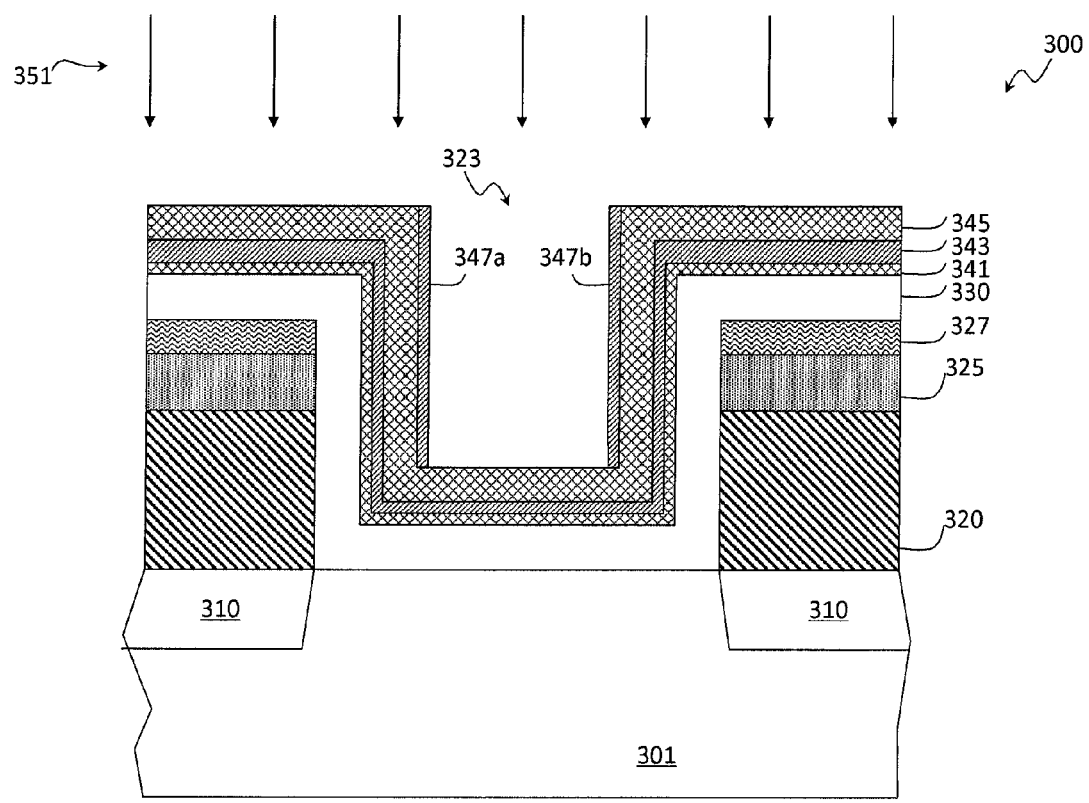

In some embodiments, the block 230 can include an etch process 351 to remove portions of the dielectric material 347 to expose portions of the dielectric material 345 as shown in FIG. 3D. In some embodiments, the etch process 351 is anisotropic etch process and has a higher etch rate to the dielectric material 347 than that to the dielectric material 345. The portions of the dielectric material 347 that are laterally disposed over the dielectric material 345 can be removed.

After the etch process, dielectric layers 347a and 347b can remain on sidewalls of the dielectric material 345. In some embodiments, the top surfaces (not labeled) of the dielectric layer 347a and 347b can be substantially leveled with the top surface of the dielectric material 345 as shown in FIG. 3D. In other embodiments, the top surfaces (not labeled) of the dielectric layer 347a and 347b may be below the top surface of the dielectric material 345.

Figure 3E:
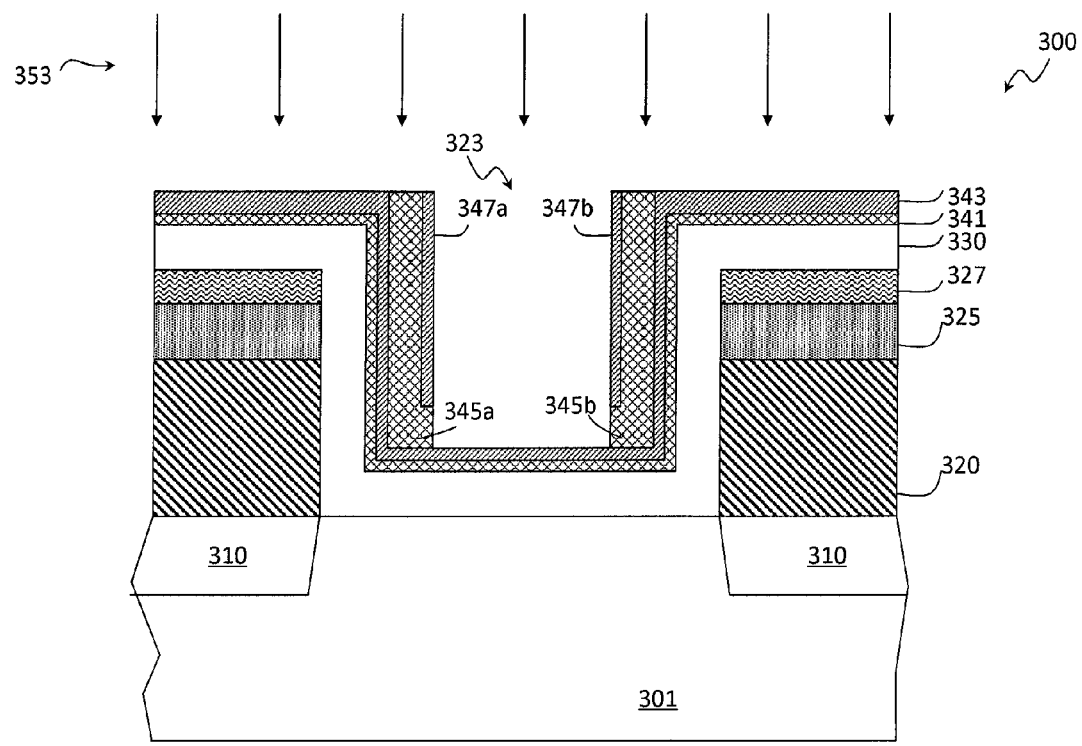

In some embodiments, the block 230 can include an etch process 353 to remove portions of the dielectric material 345 to expose portions of the dielectric material 343 as shown in FIG. 3E. In some embodiments, the etch process 353 is anisotropic etch process and has a higher etch rate to the dielectric material 345 than that to the dielectric material 343. The portions of the dielectric material 345 that are laterally disposed over the dielectric material 343 can be removed. In some embodiments, the etch process 353 can also remove portions of the dielectric layers 347a and 347b that are shown in FIG. 3D.

After the etch process, dielectric layers 345a and 345b can remain between the dielectric material 343 and the dielectric layer 347a and between the dielectric material 343 and the dielectric layer 347b, respectively. In some embodiments, the top surfaces (not labeled) of the dielectric layer 345a and 345b can be substantially leveled with the top (not labeled) surface of the dielectric material 343 as shown in FIG. 3E. In other embodiments, the top surfaces of the dielectric layer 345a and 345b may be below the top surface of the dielectric material 343. In still other embodiments, the top surfaces of the dielectric layer 345a and 345b may be above the top surface of the dielectric layers 347a and 347b.

Figure 3F:
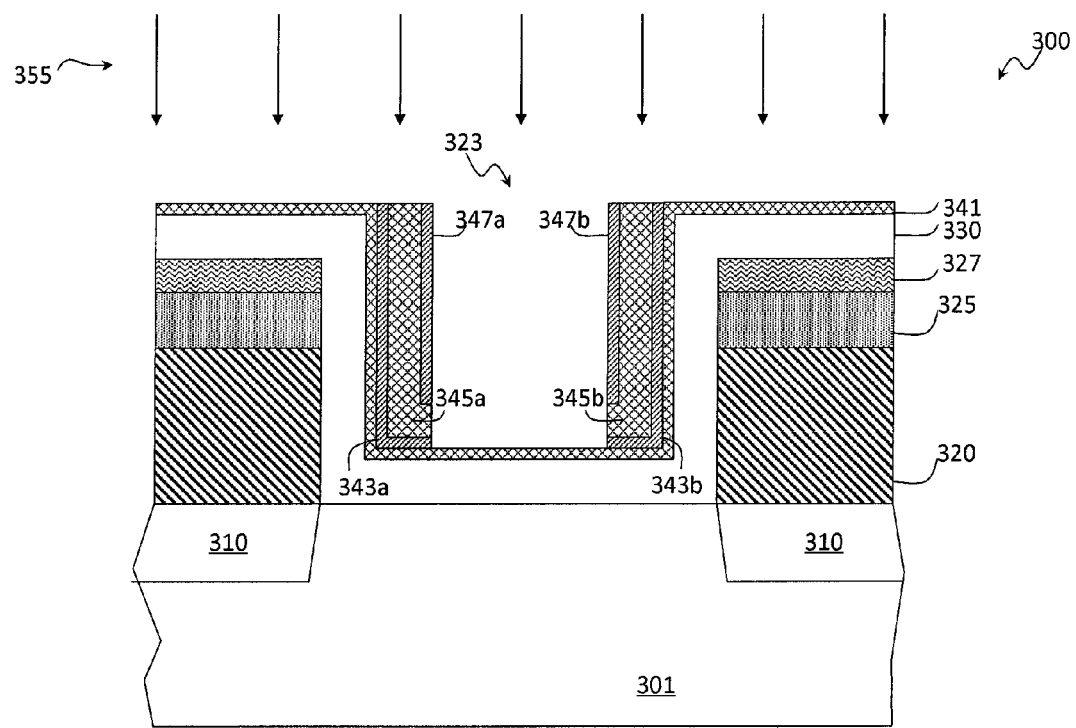

In some embodiments, the block 230 can include an etch process 355 to remove portions of the dielectric material 343 to expose portions of the dielectric material 341 as shown in FIG. 3F. In some embodiments, the etch process 355 is anisotropic etch process and has a higher etch rate to the dielectric material 343 than that to the dielectric material 341. The portions of the dielectric material 343 that are laterally disposed over the dielectric material 341 can be removed. In some embodiments, the etch process 355 can also remove portions of the dielectric layers 345a, 345b and/or 347a, 347b that are shown in FIG. 3E.

After the etch process, dielectric layers 343a and 343b can remain between the dielectric material 341 and the dielectric layer 345a and between the dielectric material 341 and the dielectric layer 345b, respectively. In some embodiments, the top surfaces (not labeled) of the dielectric layer 343a and 343b can be substantially leveled with the top surface (not labeled) of the dielectric material 341 as shown in FIG. 3E. In other embodiments, the top surfaces of the dielectric layer 343a and 343b may be below the top surface of the dielectric material 341. In still other embodiments, the top surfaces of the dielectric layer 343a and 343b may be above the top surface of the dielectric layers 345a and 345b. In yet still other embodiments, the top surfaces of the dielectric layer 345a and 345b may be above the top surface of the dielectric layers 347a and 347b.

Figure 3G:
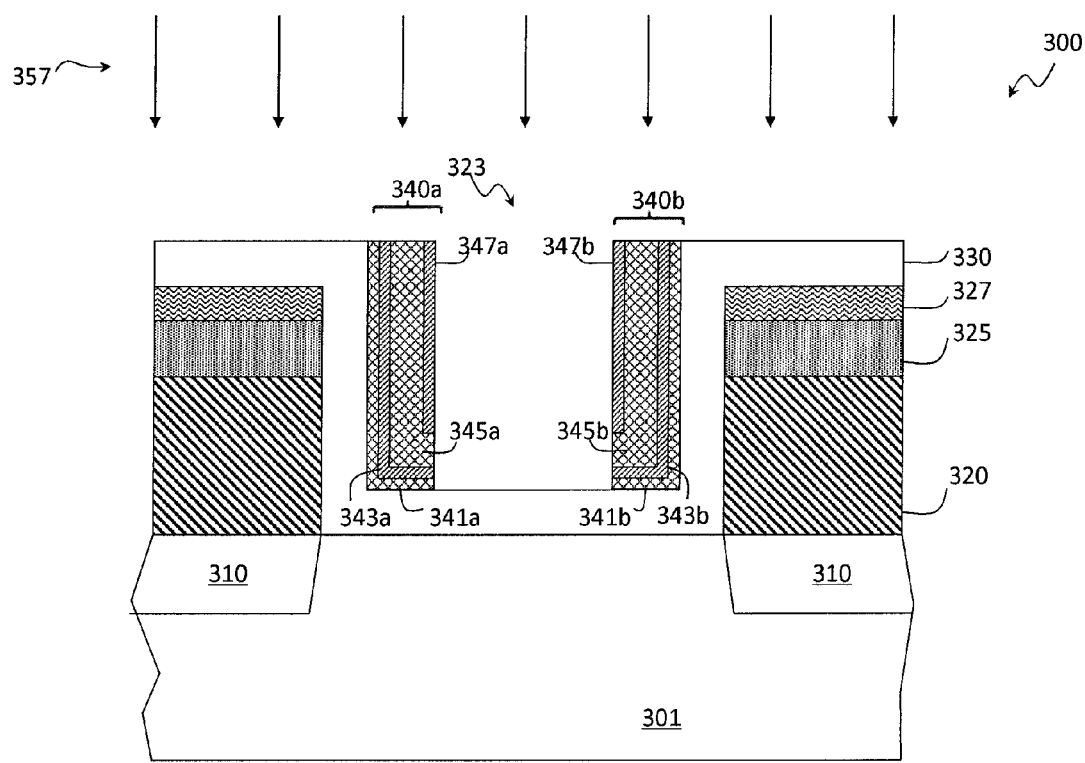

In some embodiments, the block 230 can include an etch process 357 to remove portions of the dielectric material 341 to expose portions of the germanium-containing material 330 as shown in FIG. 3G. Isolation structures 340a and 340b can each be formed on the respective sidewall of the germanium-containing material 330. In some embodiments, the etch process 357 is anisotropic etch process and has a higher etch rate to the dielectric material 341 than that to the germanium-containing material 330. The portions of the dielectric material 341 that are laterally disposed over the germanium-containing material 330 can be removed. In some embodiments, the etch process 357 can also remove portions of the dielectric layers 343a, 343b, 345a, 345b, 347a and/or 347b that are shown in FIG. 3F.

After the etch process, dielectric layers 341a and 341b can remain between the germanium-containing material 330 and the dielectric layer 343a and between the germanium-containing material 330 and the dielectric layer 343b, respectively. In some embodiments, the top surfaces (not labeled) of the dielectric layer 341a and 341b can be substantially leveled with the top surface (not labeled) of the germanium-containing material 330 as shown in FIG. 3G. In other embodiments, the top surfaces of the dielectric layer 341a and 341b may be below the top surface of the germanium-containing material 330. In still other embodiments, the top surfaces of the dielectric layer 341a and 341b may be above the top surface of the dielectric layers 343a and 343b. In yet still other embodiments, the top surfaces of the dielectric layer 343a and 343b may be above the top surface of the dielectric layers 345a and 345b. In yet still other embodiments, the top surfaces of the dielectric layer 345a and 345b may be above the top surface of the dielectric layers 347a and 347b.

Figure 3H:
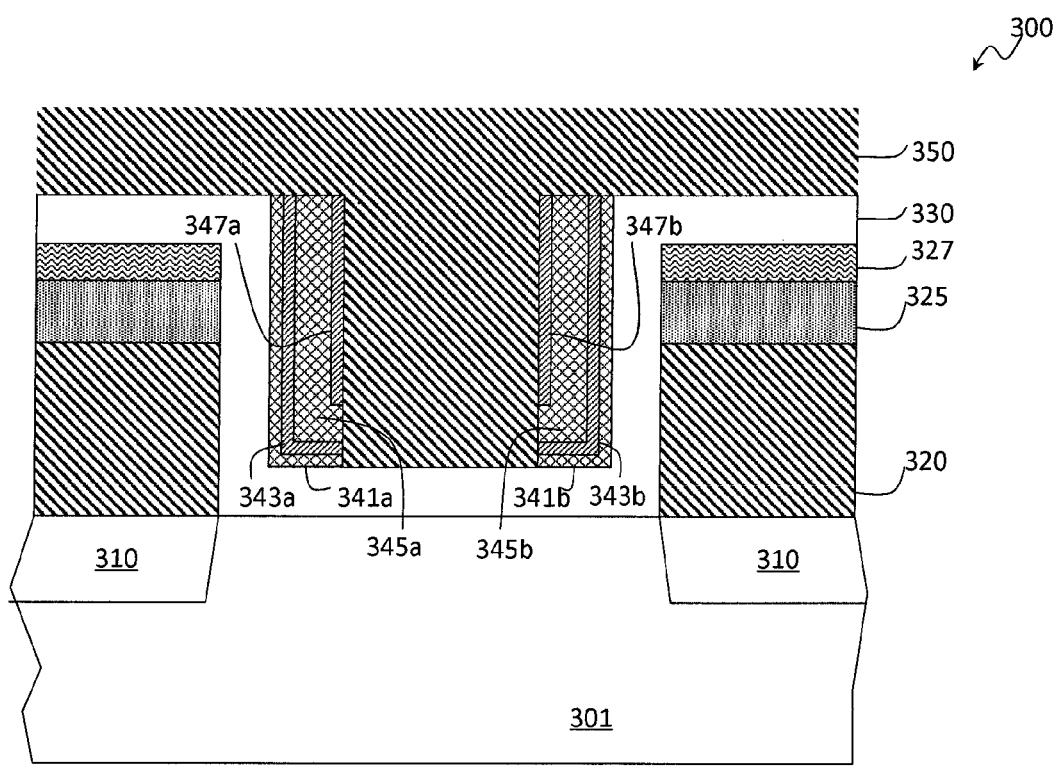

Referring to FIG. 2, the block 240 can include forming a second electrode disposed in the opening. For example, the block 240 can include forming an electrode material 350 within the opening 323 and over the germanium-containing material 330 as shown in FIG. 3H. The electrode material 350 can be formed by, for example, a CVD process.

Figure 3I:
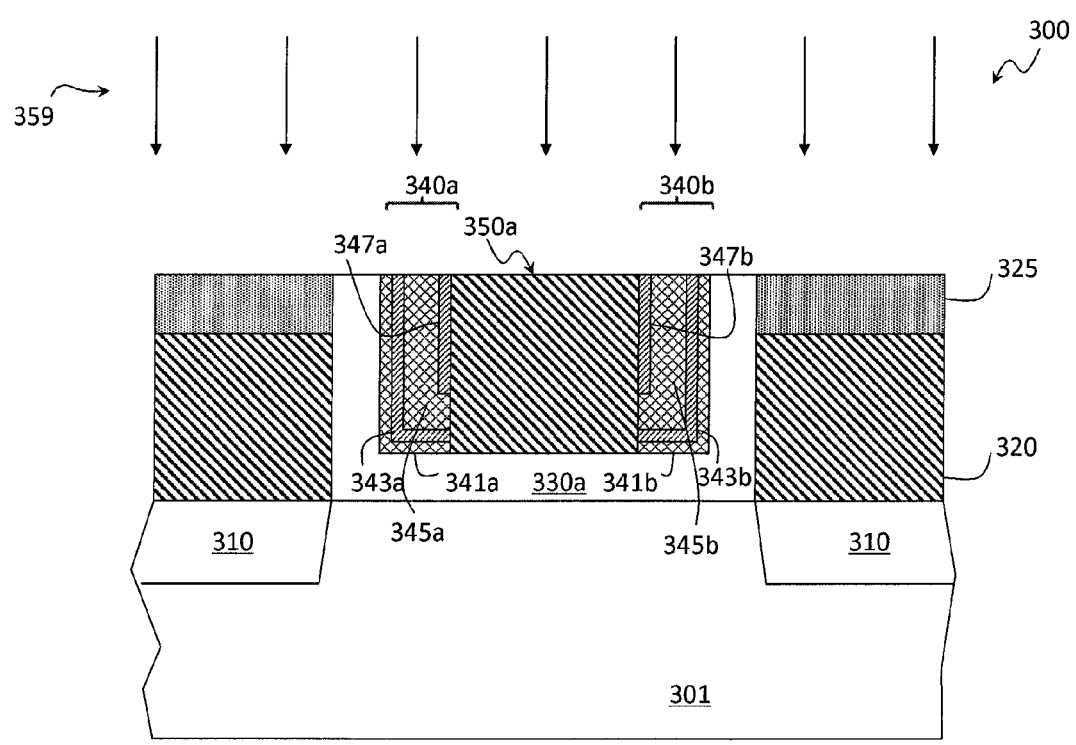

In some embodiments, the block 240 can include a removing process 359 to remove portions of the electrode material 350 and the silicon-containing layer 327 that are over the etch-stop layer 325 as shown in FIG. 3I. In some embodiments, the removing process 359 can include a chemical mechanical polish (CMP) process. After the removing process 359, an electrode 350a can be formed in the opening 323 (shown in FIG. 3H). A germanium-containing layer 330a can be formed around the electrode 350.

In a first embodiment of the application, an integrated circuit includes a bipolar transistor disposed over a substrate. The bipolar transistor includes a base electrode disposed around at least one germanium-containing layer. An emitter electrode is disposed over the at least one germanium-containing layer. At least one isolation structure is disposed between the emitter electrode and the at least one germanium-containing layer. A top surface of the at least one isolation structure is disposed between and electrically isolates a top surface of the emitter electrode from a top surface of the at least one germanium-containing layer.

In a second embodiment of the application, an integrated circuit includes a first electrode having an opening disposed over a substrate. At least one germanium-containing layer is disposed along a sidewall and a bottom of the opening. At least one isolation structure is disposed adjacent to a sidewall of the at least one germanium-containing layer. A second electrode is disposed in the opening. The top surface of the at least one isolation structure is disposed between and electrically isolates a top surface of the emitter electrode from a top surface of the at least one germanium-containing layer.

In a second embodiment of the application, a method of forming an integrated circuit includes forming a first electrode having an opening over a substrate. At least one germanium-containing layer is formed along a sidewall and a bottom of the opening. At least one isolation structure is formed adjacent to a sidewall of the germanium-containing layer. A second electrode is formed in the opening. A top surface of the at least one isolation structure is formed between and electrically isolates a top surface of the emitter electrode from a top surface of the at least one germanium-containing layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a substrate; and
   a bipolar transistor disposed over the substrate, the bipolar transistor comprising:
      a base electrode disposed around at least one germanium-containing layer;
      an emitter electrode disposed over the at least one germanium-containing layer; and
      at least one isolation structure disposed between the emitter electrode and the at least one germanium-containing layer, a top surface of the at least one isolation structure being disposed between and electrically isolating a top surface of the emitter electrode from a top surface of the at least one germanium-containing layer, wherein the at least one isolation structure includes:
      a first dielectric layer disposed adjacent to a sidewall of the emitter electrode; and
      a second dielectric layer disposed adjacent to the first dielectric layer and in direct contact with the emitter electrode, wherein the second dielectric layer and the first dielectric layer have different etch selectivity.

2. The integrated circuit of claim 1, wherein the top surface of the at least one isolation structure is substantially leveled with or below the top surface of the at least one germanium-containing layer.

3. The integrated circuit of claim 1, wherein the at least one germanium-containing layer is disposed along a sidewall and a bottom of an opening of the base electrode, and the at least one isolation structure is disposed adjacent to the sidewall of the opening.

4. The integrated circuit of claim 1, wherein the at least one isolation structure has a top width and a bottom width, and the top width is substantially equal to or smaller than the bottom width.

5. The integrated circuit of claim 4, wherein the top width is about 23% or less smaller than the bottom width.

6. The integrated circuit of claim 1, wherein the at least one isolation structure further includes:
   a third dielectric layer disposed adjacent to the second dielectric layer; and
   a fourth dielectric layer disposed adjacent to the third dielectric layer, wherein the fourth dielectric layer and the third dielectric layer have different etch selectivity.

7. The integrated circuit of claim 6, wherein the first and third dielectric layers are made of silicon oxide and the second and fourth dielectric layers are made of a material selected from a group consisting of silicon nitride, silicon oxynitride, silicon carbide, silicon oxycarbide, silicon carbon nitride and silicon oxycarbon nitride.

8. The integrated circuit of claim 6, wherein the first, second, third and fourth dielectric layers have surfaces that are substantially aligned with each other and perpendicular to a surface of the substrate.

9. An integrated circuit comprising:
   a first electrode having an opening disposed over a substrate;

at least one germanium-containing layer disposed along a sidewall and a bottom of the opening;

at least one isolation structure disposed adjacent to a sidewall of the at least one germanium-containing layer, wherein the at least one isolation structure is a multi-layer structure; and a second electrode disposed in the opening, wherein a top surface of the at least one isolation structure is disposed between and electrically isolates a top surface of an emitter electrode from a top surface of the at least one germanium-containing layer, wherein the second electrode is in direct contact with each layer of the multi-layer structure of the at least one isolation structure.

10. The integrated circuit of claim 9, wherein the at least one isolation structure has a top width and a bottom width, and the top width is substantially equal to or smaller than the bottom width.

11. The integrated circuit of claim 9, wherein the at least one isolation structure includes:

a first dielectric layer disposed adjacent to a sidewall of the at least one germanium-containing layer; and a second dielectric layer disposed adjacent to the first dielectric layer, wherein the second dielectric layer and the first dielectric layer have different etch selectivity.

12. The integrated circuit of claim 11, wherein the at least one isolation structure further includes:

a third dielectric layer disposed adjacent to the second dielectric layer; and a fourth dielectric layer disposed adjacent to the third dielectric layer, wherein the fourth dielectric layer and the third dielectric layer have different etch selectivity.

13. The integrated circuit of claim 12, wherein the first and third dielectric layers are made of silicon oxide and the second and fourth dielectric layers are made of a material selected from a group consisting of silicon nitride, silicon oxynitride, silicon carbide, silicon oxycarbide, silicon carbon nitride and silicon oxycarbon nitride.

14. A method of forming an integrated circuit, the method comprising:

forming a first electrode having an opening over a substrate;

forming at least one germanium-containing layer along a sidewall and a bottom of the opening;

forming at least one isolation structure adjacent to a sidewall of the at least one germanium-containing layer, wherein forming the at least one isolation structure includes:

forming a first dielectric layer adjacent to a sidewall of the at least one germanium-containing layer;

forming a second dielectric layer adjacent to the first dielectric layer; and removing a portion of the first dielectric layer and a portion of the second dielectric layer to expose portions of the at least one germanium-containing layer; and forming a second electrode disposed in the opening, wherein a top surface of the at least one isolation structure is formed between and electrically isolates a top surface of an emitter gate electrode from a top surface of the at least one germanium-containing layer.

15. The method of claim 14, wherein forming
the first dielectric layer and
forming the second dielectric layer comprising forming the second dielectric layer and the first dielectric layer having different etch selectivity.

16. The method of claim 15, wherein forming the at least one isolation structure further includes:

forming a third dielectric layer adjacent to the second dielectric layer; and forming a fourth dielectric layer adjacent to the third dielectric layer, wherein the fourth dielectric layer and the third dielectric layer have different etch selectivity.

17. The method of claim 16, wherein the first and third dielectric layers are made of silicon oxide and the second and fourth dielectric layers are made of a material selected from a group consisting of silicon nitride, silicon oxynitride, silicon carbide, silicon oxycarbide, silicon carbon nitride and silicon oxycarbon nitride.

18. The method of claim 16, wherein forming the first, second, third and fourth dielectric layers comprise:

forming a first, second, third and fourth dielectric materials sequentially over the at least one germanium containing layer;

removing portions of the fourth dielectric material to expose portions of the third dielectric material;

removing portions of the third dielectric material to expose portions of the second dielectric material; and removing portions of the second dielectric material to expose portions of the first dielectric material.

19. The method of claim 18, wherein forming the first, second, third and fourth dielectric layers further comprise:

removing portions of the third and fourth dielectric materials to expose portions of at least one germanium-containing layer.

20. The method of claim 14, wherein the at least one isolation structure has a top width and a bottom width, and the top width is substantially equal to the bottom width.

* * * * *